United States Patent
Lin et al.

(10) Patent No.: US 9,875,964 B2
(45) Date of Patent: Jan. 23, 2018

(54) SEMICONDUCTOR DEVICE COMPONENTS AND METHODS

(71) Applicant: Taiwan Semiconductor Manufacturing Company, Ltd., Hsin-Chu (TW)

(72) Inventors: Bi-Ling Lin, Hsin-Chu (TW); Jian-Hong Lin, Yunlin (TW); Ming-Hong Hsieh, Bade (TW); Lee-Der Chen, Chupei (TW); Jiaw-Ren Shih, Hsin-Chu (TW); Chwei-Ching Chiu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 886 days.

(21) Appl. No.: 14/166,686

(22) Filed: Jan. 28, 2014

(65) Prior Publication Data

US 2014/0145194 A1    May 29, 2014

Related U.S. Application Data

(63) Continuation of application No. 13/231,812, filed on Sep. 13, 2011, now Pat. No. 8,648,592.

(51) Int. Cl.
*H01L 23/48* (2006.01)
*H01L 23/525* (2006.01)
*H01L 21/66* (2006.01)
*H01L 23/522* (2006.01)
*G01R 31/28* (2006.01)

(52) U.S. Cl.
CPC ...... *H01L 23/5256* (2013.01); *G01R 31/2858* (2013.01); *G01R 31/2884* (2013.01); *H01L 22/34* (2013.01); *H01L 23/522* (2013.01); *G01R 31/2853* (2013.01); *H01L 2924/0002* (2013.01)

(58) Field of Classification Search
CPC .................. H01L 23/5256; H01L 23/5258
See application file for complete search history.

(56) References Cited

U.S. PATENT DOCUMENTS

| | | | |
|---|---|---|---|
| 6,680,484 B1 | 1/2004 | Young | |
| 6,867,056 B1 | 3/2005 | Hau-Riege et al. | |
| 2007/0063313 A1* | 3/2007 | Barth | H01L 23/5256 257/529 |
| 2007/0132059 A1* | 6/2007 | Tsai | H01L 23/5258 257/530 |
| 2008/0237787 A1* | 10/2008 | Yonezu | H01L 23/5256 257/529 |

(Continued)

OTHER PUBLICATIONS

Geppert, L. "Electrical Fuse Lets Chips Heal Themselves," IEEE Spectrum, Oct. 2004, pp. 16, 18, and 20.

*Primary Examiner* — Cuong Q Nguyen
(74) *Attorney, Agent, or Firm* — Slater Matsil, LLP

(57) ABSTRACT

Semiconductor device components and methods are disclosed. In one embodiment, a semiconductor device component includes a conductive segment having a first surface, a second surface opposite the first surface, a first end, and a second end opposite the first end. A first via is coupled to the second surface of the conductive segment at the first end. A second via is coupled to the first surface of the conductive segment at the second end, and a third via is coupled to the second surface of the conductive segment at the second end.

21 Claims, 5 Drawing Sheets

(56) References Cited

U.S. PATENT DOCUMENTS

| | | | |
|---|---|---|---|
| 2009/0081812 A1* | 3/2009 | Tanaka ................ | H01L 21/2855 |
| | | | 438/6 |
| 2010/0118636 A1* | 5/2010 | Chanda ............... | H01L 23/5256 |
| | | | 365/225.7 |
| 2011/0248379 A1* | 10/2011 | Yonezu ............... | H01L 23/5256 |
| | | | 257/529 |

* cited by examiner

SEMICONDUCTOR DEVICE COMPONENTS AND METHODS

CROSS-REFERENCE TO RELATED APPLICATIONS

This application is a continuation of U.S. patent application Ser. No. 13/231,812, filed Sep. 13, 2011, which is incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as devices are decreased in size, manufacturing and reliability issues arise. For example, as the structure size in electronics such as integrated circuits (ICs) is decreased, the problem of electromigration increases.

Electromigration is a transport of material caused by the gradual movement or migration of atoms in a conductor resulting from current flow, due to momentum transfer between conducting electrons and diffusing metal atoms. The electromigration effect can be significant in applications in which high current densities and high temperatures are used, such as in microelectronics. Electromigration decreases reliability of integrated circuits, and can lead to the eventual loss of one or more connections or intermittent failures. The migration of atoms can cause thinning or voids at one end of a conductive line due to vacated atoms, and can cause hillocks or a build-up of material at the other end of the conductive line due to accumulated atoms. The changes in the shape of the conductive line can cause increased resistance and can result in open circuits or short circuits.

What are needed in the art are improved methods and structures for testing and characterizing electromigration in conductive material layers of semiconductor devices.

An electrically programmed fuse (eFuse) is an on-chip component of semiconductor devices that is programmed using electromigration, by running a high amount of current through the eFuse. EFuses are used to alter ICs by connecting or disconnecting redundant circuits or memory cells, to repair the ICs or increase the number of usable ICs on a wafer, for example.

What are also needed in the art are improved eFuse structures and methods of manufacture thereof.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 5 illustrates a semiconductor wafer and various locations on the wafer that the semiconductor device component of embodiments of the present disclosure may be formed on;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to electromigration tests of semiconductor devices and components of semiconductor devices that are altered using electromigration. Novel semiconductor device components and methods comprising electromigration test structures and eFuses will be described herein that have at least three vias coupled to a conductive segment that comprises an electromigration (EM) test line of an electromigration test structure or a fuse link of an eFuse.

Figure 1:
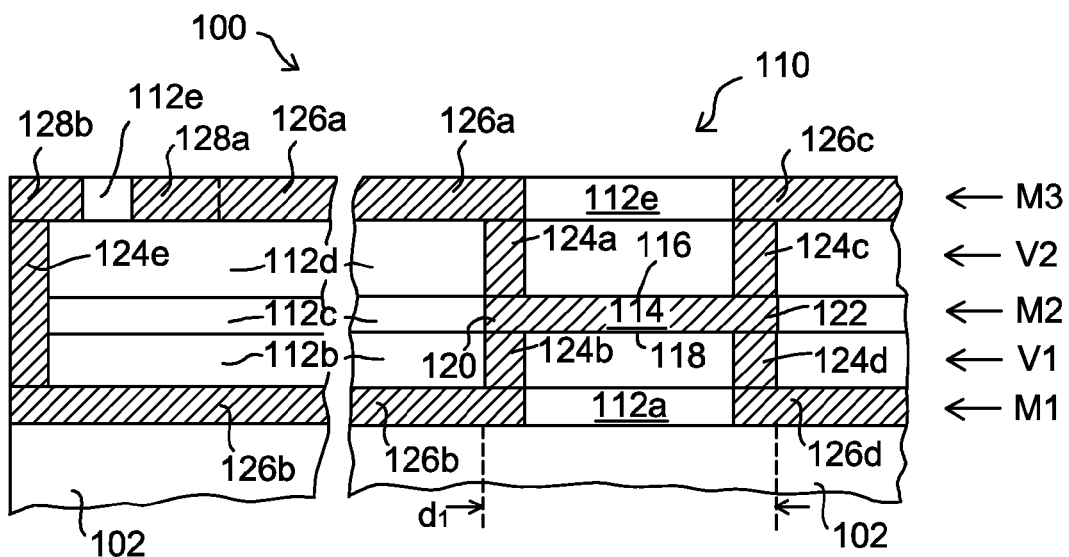
FIG. 1 shows a cross-sectional view of a novel semiconductor device component in accordance with an embodiment of the present disclosure.

Referring first to FIG. 1, a cross-sectional view of a novel semiconductor device component 110 in accordance with an embodiment of the present disclosure is shown. The semiconductor device component 110 is formed in a plurality of metallization layers V1, M1, and V2. The semiconductor device component 110 may comprise an electromigration test structure or an eFuse, for example.

The semiconductor device component 110 includes a conductive segment 114 having a first surface 116 and a second surface 118 opposite the first surface 116. The conductive segment 114 has a first end 120 and a second end 122 opposite the first end 120. The conductive segment 114 may comprise an EM test line or a stress line of an electromigration test structure. The conductive segment 114 may alternatively comprise a fuse link of an eFuse. The conductive segment 114 may comprise a width in a top view that is a minimum feature size of the semiconductor device in some embodiments. At least three vias 124b, 124c, and 124d are electrically coupled to the conductive segment 114, to be described further herein.

The semiconductor device component 110 includes a first via 124b coupled to the second surface 118 of the conductive segment 114 at the first end 120. The first via 124b is coupled to and is disposed below the conductive segment 114 in an adjacent layer V1 at the first end 120. The semiconductor device component 110 also includes a second via 124c coupled to the first surface 116 of the conductive segment 114 at the second end 122. The second via 124c is coupled to and is disposed over the conductive segment 114 in an adjacent layer V2 at the second end 122. The semiconductor device component 110 further includes a third via 124d coupled to the second surface 118 of the conductive segment 114 at the second end 122. The third via 124d is coupled to and is disposed below the conductive segment 114 in an adjacent layer V1 at the second end 122.

The semiconductor device component 110 may include an optional fourth via 124a coupled to the first surface 116 of the conductive segment 114 at the first end 120, in some embodiments. The fourth via 124a is coupled to and is disposed over the conductive segment 114 in an adjacent layer V2 at the first end 120, as shown. The fourth via 124a is shown in the cross-sectional view of the semiconductor device component 110 in FIG. 1; however, alternatively, the fourth via 124a may not be included in the structure in some embodiments.

The first via 124b is coupled to the second surface 118 of the conductive segment 114 proximate the fourth via 124a (if included), and the third via 124d is coupled to the second surface 118 of the conductive segment 114 proximate the second via 124c. In some embodiments, the fourth via 124a is disposed directly over the first via 124b above the conductive segment 114, and the second via 124c is disposed directly over the third via 124d above the conductive segment 114, as shown.

A first conductive line 126b is coupled to the first via 124b, to the bottom of the first via 124b in an adjacent layer M1. Likewise, a second conductive line 126c is coupled to the second via 124c and a third conductive line 126d is coupled to the third via 124d in adjacent layers M1 and M3, respectively, as shown in the cross-sectional view of FIG. 1. An optional fourth conductive line 126a may be coupled to the fourth via 124a, if the optional fourth via 124a is included in the structure. For example, the fourth conductive line 126a is electrically coupled to the top of the fourth via 124a in an adjacent layer M3.

The conductive lines 126a, 126b, 126c, and 126d are coupled to contact pads 128a, 128b (and 128c and 128d, not shown), respectively, which may be electrically contacted for testing of the semiconductor device component 110, in embodiments wherein the semiconductor device component 110 comprises an electromigration test structure, for example. The novel semiconductor device component 110 provides the ability to test the metallization layers V1, M2, and V2 for electromigration properties and damage by performing tests on the semiconductor device component 110, in embodiments wherein the semiconductor device component 110 comprises an electromigration test structure, to be described further herein. Alternatively, the contact pads 128a, 128b (and 128c and 128d, not shown), respectively, may be electrically contacted for programming of the semiconductor device component 110, in embodiments wherein the semiconductor device component 110 comprises an eFuse.

The semiconductor device component 110 is formed on a semiconductor device 100. The semiconductor device 100 includes a workpiece 102 that comprises a semiconductor substrate comprising silicon or other semiconductor materials which may be covered by an insulating layer, for example. The workpiece 102 may also include other active components or circuits formed thereon, not shown. The workpiece 102 may comprise silicon oxide over single-crystal silicon, for example. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

The semiconductor device component 110 may be formed over an unused or non-active region or over an active region of the semiconductor device 100. For example, the workpiece 102 may include other conductive layers or other semiconductor elements, e.g., transistors, diodes, etc., not shown. The workpiece 102 may comprise one or more layers of electrical circuitry and/or electronic functions formed thereon, and may include conductive lines, vias, capacitors, diodes, transistors, resistors, inductors, and/or other electrical components formed in a front end of the line (FEOL) process, for example (not shown). The semiconductor device component 110 may be formed over or proximate the electrical circuitry formed in or on the workpiece 102 in some embodiments.

The novel semiconductor device component 110 of embodiments of the present disclosure may be formed in a back-end-of-line (BEOL) process in upper metallization layers M1, V1, M2, V2, M3, or other additional metallization layers of the semiconductor device 100. Metallization layers M1, M2, and M3 comprise metal layers where conductive lines are formed over active areas elsewhere over the workpiece 102 (not shown), and via layers V1 and V2 comprise metal layers where vias are formed elsewhere over the workpiece 102 (also not shown). The first conductive line 126b and the third conductive line 126d are disposed in a first metallization layer M1 over the workpiece 102 of the semiconductor device 100. The conductive segment 114 is disposed in a second metallization layer M2 disposed over the first metallization layer M1. The fourth conductive line 126a and the second conductive line 126c are disposed in a third metallization layer M3 disposed over the second metallization layer M2. The first via 124b and the third via 124d are disposed in a fourth via layer V1 disposed between the first metallization layer M1 and the second metallization layer M2. The fourth via 124a and the second via 124c are disposed in a first via layer V2 disposed between the second metallization layer M2 and the third metallization layer M3.

The metallization layers M1, V1, M2, V2, and M3 may be formed using damascene or subtractive etch techniques. In a damascene process, to form the first metallization layer M1, for example, an insulating material 112a is deposited over the workpiece 102. The insulating material 112a may comprise silicon dioxide, silicon nitride, high or low dielectric constant (k) materials, or combinations or multiple layers thereof, as examples. The insulating material 112a is patterned using lithography with a pattern for the first conductive line 126b and the third conductive line 126d that are used for electrical access to the semiconductor device component 110. A conductive material comprising one or more metals is then deposited over the insulating material 112a, filling the patterns in the insulating material 112a and forming the first and third conductive lines 126b and 126d. The conductive material may comprise copper, copper alloys, or other metals, as examples. Excess conductive material is removed from over the insulating material 112a using one or more chemical-mechanical polish (CMP) processes and/or etch processes, forming the first and third conductive lines 126b and 126d, in a single damascene process.

The first and third conductive lines 126b and 126d may also be formed using a subtractive etch process by depositing the conductive material and patterning the conductive material using lithography. Then the insulating material 112a is formed between the first and third conductive lines 126b and 126d. Alternatively, the first and third conductive lines 126b and 126d may be formed over the workpiece 102 in the first metallization layer M1 using other methods.

The other metallization layers V1, M2, V2, and M3 may also be formed using the methods described for the first metallization layer M1. Two adjacent metallization layers (i.e., V1 and M2 or V2 and M3, as examples) may also be formed using a dual damascene process.

The first metallization layer M1 includes the first and third conductive lines 126b and 126d formed within the insulating material 112a. The first via layer V1 includes the first and third vias 124b and 124d formed within an insulating material 112b. Likewise, the second metallization layer M2 includes the conductive segment 114 formed within an insulating material 112c, the second via layer V2 includes the fourth and second vias 124a and 124c formed within an insulating material 112d, and the third metallization layer M3 includes the fourth and second conductive lines 126a and 126c formed within an insulating material 112e.

Only one semiconductor device component 110 is shown in FIG. 1; alternatively, two or more semiconductor device components 110 may be formed over the workpiece 102 in accordance with embodiments of the disclosure, in various locations over the workpiece 102 or on a semiconductor wafer. The metallization layers M1, V1, M2, V2, and M3 are shown as examples; the semiconductor device component 110 may be formed in any of the metallization layers of the semiconductor device 100. The contact pads 128a and 128b are shown in the third metallization layer M3 in the example shown; alternatively, the contact pads 128a and 128b may be located on another top metallization layer Mx of the semiconductor device 100, and the contact pads 128a, 128b, 128c, and 128d may be coupled to the underlying conductive lines 126a, 126b, 126c, and 126d. For example, contact pad 128b is coupled to underlying conductive line 126b by a via 124e that extends through multiple metallization layers V1, M2, and V2 within the insulating materials 112b, 112c, and 112d.

Figure 2:
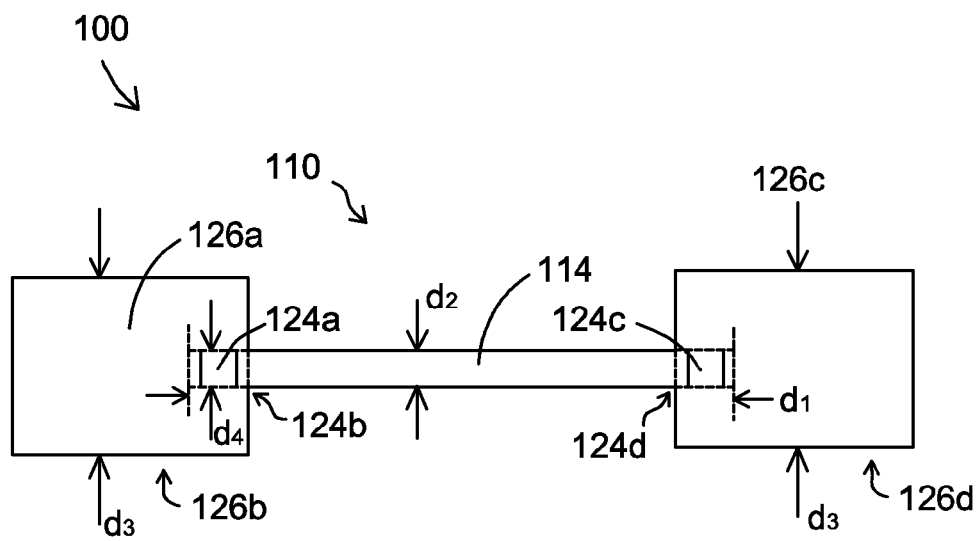
FIG. 2 is a top view of the semiconductor device component shown in FIG. 1.

The conductive segment 114 comprises a length of dimension $d_1$, where dimension $d_1$ may comprise about 0.01 to 1,200 μm, as an example. FIG. 2 shows a top view of the semiconductor device component 110 shown in FIG. 1. The conductive segment 114 comprises a width in a top view comprising dimension $d_2$, wherein dimension $d_2$ comprises about 0.01 to 0.1 μm, for example. Dimension $d_2$ is also referred to herein as a first width. In some embodiments, dimension $d_2$ may comprise a minimum feature size or minimum metal width of the semiconductor device 100, for example. The conductive lines 126a and 126c (and also conductive lines 126b and 126d, which are disposed beneath conductive lines 126a and 126c, respectively) comprise a width in a top view comprising dimension $d_3$. Dimension $d_3$ is also referred to herein as a second width. The second width of dimension $d_3$ is larger than the first width of dimension $d_2$ in some embodiments, for example. Dimension $d_3$ is at least twice as large as dimension $d_2$, and in some embodiments, dimension $d_3$ is about three times larger than dimension $d_2$, as another example. At least a portion of the vias 124a and 124c (and also vias 124b and 124d, which are disposed beneath vias 124a and 124c, respectively) comprise a width comprising dimension $d_4$. Dimension $d_4$ may comprise substantially the same dimension as dimension $d_2$ in some embodiments. Alternatively, dimensions $d_1$, $d_2$, $d_3$, and $d_4$ may comprise other values. The conductive line 126a, 126b, 126c, and 126d widths comprising dimension $d_3$ are larger than the widths of the conductive segment 114 and vias 124a, 124b, 124c, and 124d so that the conductive lines 126a, 126b, 126c, and 126d are capable of applying a relative large amount of current, yet are not affected by electromigration effects during a testing process in embodiments wherein the semiconductor device component 110 comprises an electromigration test structure, or during a programming process in embodiments wherein the semiconductor device component 110 comprises an eFuse, for example, in some embodiments.

Figure 3:
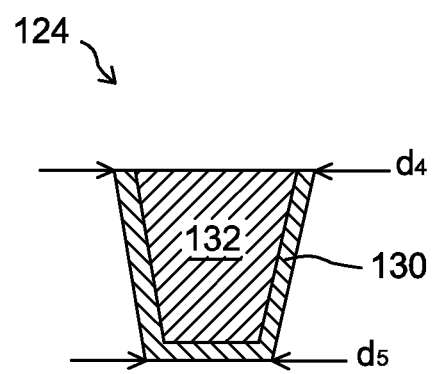
FIG. 3 shows a more detailed cross-sectional view of a via of the semiconductor device component.
Figure 4:
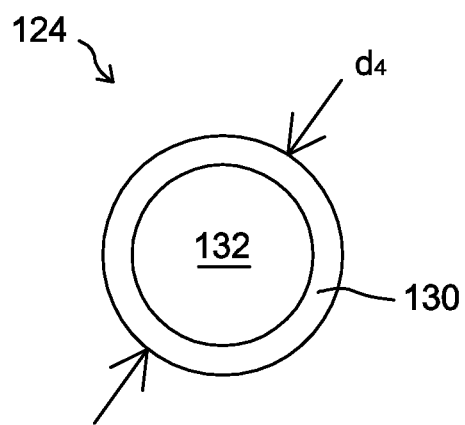
FIG. 4 is a top view of the via shown in FIG. 3.

FIG. 3 shows a more detailed cross-sectional view of a via 124 such as vias 124a, 124b, 124c, or 124d of the semiconductor device component 110. FIG. 4 shows a top view of the via 124 shown in FIG. 3. The via 124 may include an optional barrier layer 130 and a conductive material 132 disposed over the barrier layer 130. The barrier layer 130 may comprise a thickness of about 0 to 100 Å of a Ta-based, Co-based, W-based, Ru-based, Ti-based material, or combinations or multiple layers thereof. The barrier layer 130 may comprise a bi-layer of TaN/Ta, as one example. The conductive material 132 may comprise W, Cu, a Cu alloy, or combinations or multiple layers thereof, as examples. Alternatively, the barrier layer 130 and the conductive material 132 may comprise other dimensions and materials.

A top portion of the via 124 may comprise dimension $d_4$, and a bottom portion of the via 124 may comprise a dimension $d_5$ that is smaller than dimension $d_4$, as shown. The via 124 sidewalls may be tapered, and the via 124 may be substantially round in a top view, as shown in FIG. 4. The via 124 may alternatively be square or rectangular in a top view, as shown in FIG. 2. Electromigration may tend to be a problem at the barrier layer 130 of vias 124 in some applications, and the novel semiconductor device component 110 advantageously is adapted to test for defects caused by electromigration at the barrier layer 130 of the vias 124, for example, in embodiments wherein the semiconductor device component 110 comprises an electromigration test structure.

Figure 5:
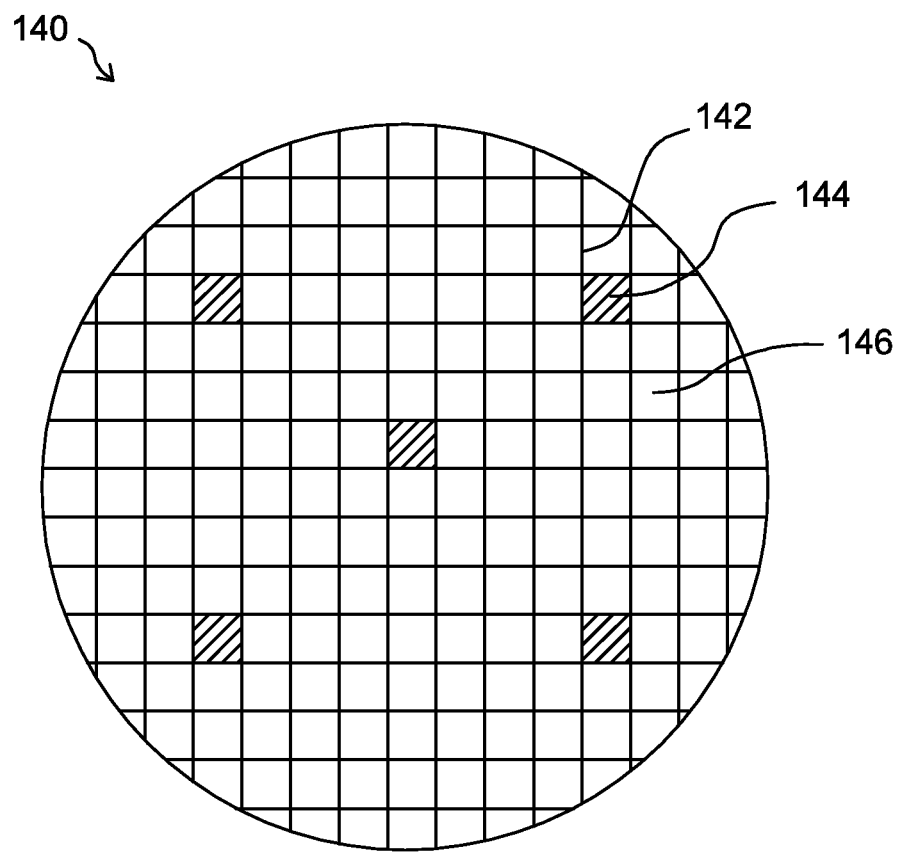

FIG. 5 illustrates a semiconductor wafer 140 and various locations on the wafer 140 that the semiconductor device component 110 of embodiments of the present disclosure can be formed on. In some applications, the semiconductor device components 110 are formed in a scribe line region 142 of the wafer 140. Electromigration tests or eFuse programming may be performed on the wafer 140 at various stages of a manufacturing process, or at the end of a manufacturing process that is used to manufacture a plurality of functional integrated circuits 146 or die that are formed on the wafer 140, for example. When the functional integrated circuits 146 are singulated or separated from each other using a die saw, the semiconductor device components 110 formed in the scribe line regions 142 are destroyed. Thus, the semiconductor device components 110 may comprise sacrificial test structures in some embodiments.

In other embodiments, the semiconductor device components 110 may be formed on dedicated test die 144 that are fabricated in predetermined positions on the wafer 140. Alternatively, the semiconductor device components 110 may be formed on functional integrated circuits 146.

Figure 6:
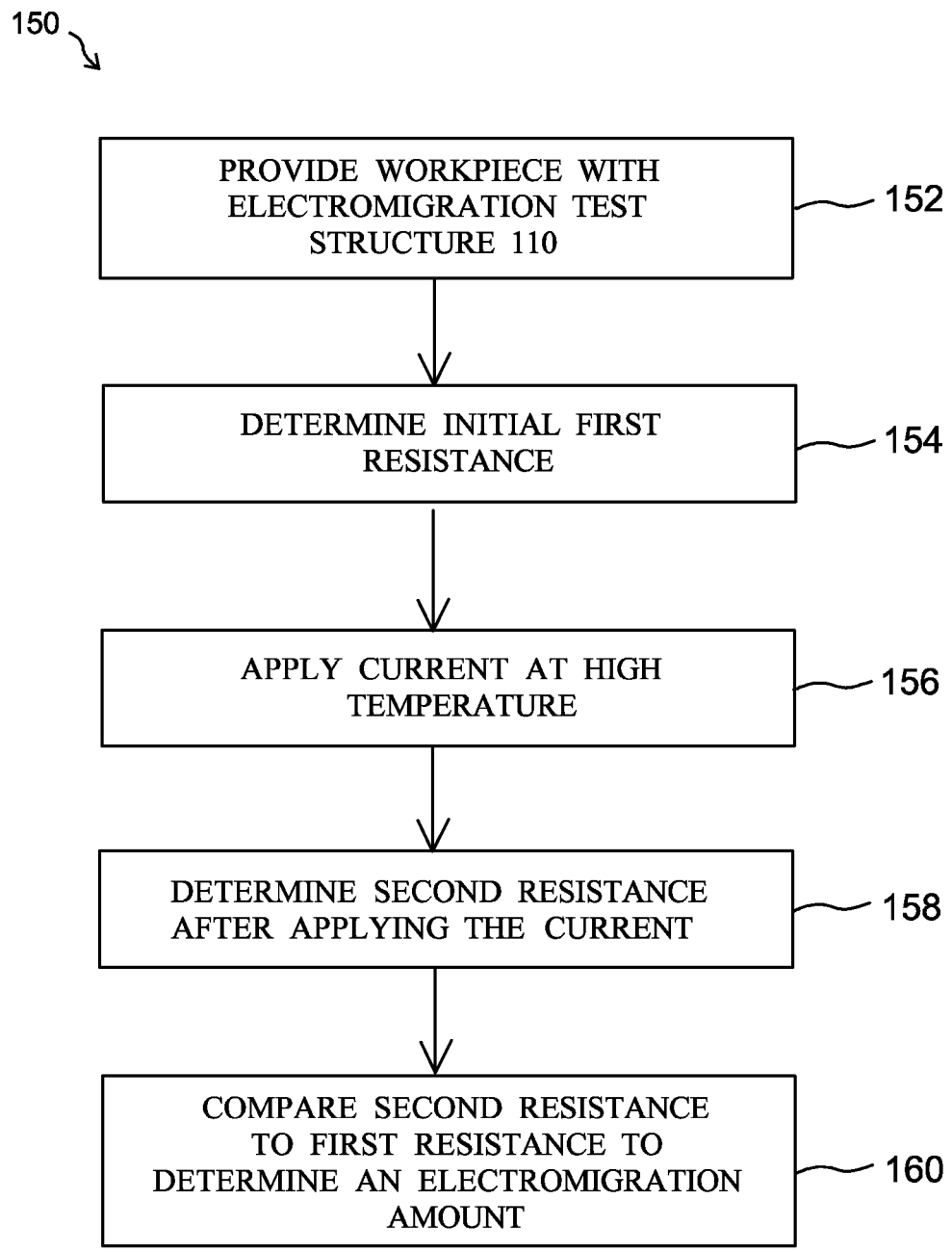
FIG. 6 is a flow chart illustrating a method of using the semiconductor device component shown in FIG. 1.

In some embodiments wherein the semiconductor device components 110 comprise electromigration test structures, the semiconductor device components 110 are adapted to be used to determine a failure due to electromigration of a portion of the semiconductor device component 110 based upon a resistance measurement of the semiconductor device component 110. FIG. 6 is a flow chart 150 illustrating a method of using the semiconductor device component 110 shown in FIG. 1 as an electromigration test structure. The method comprises testing a semiconductor device 100 by first, providing a workpiece 102 with a semiconductor device component 110 described herein formed thereon (step 152). An initial first resistance of the semiconductor device component is determined (step 154), e.g., by applying a current at a high temperature of about 250 to 350 degrees C., as an example, although the current may be applied at other temperatures, and measuring the initial first resistance.

A current is then applied to the semiconductor device component (step 156), also at a high temperature. The current applied is also referred to herein as a first current. A current of about 0.01 to 0.1 milliamperes (mA) may be applied for about 0.1 to 2,000 hours while the resistance is monitored during such stress conditions through first via 124b and third via 124d through conductive lines 124b or 124d, e.g., while applying the current from contact pad 124b to 128d, as an example. Alternatively, other amounts of currents and testing times may be used. Any of the contact pads 128a (if the fourth via 124a is included) or 128b coupled to the first side 120 of the conductive segment 114, and any of the contact pads 128c or 128d coupled to the second side 122 of the conductive segment 114, may be contacted to apply the current, for example.

A second resistance of the semiconductor device component 110 is then determined, after applying the first current (step 158). The second resistance may be determined by applying a second current to the semiconductor device component 110 using (e.g., across) contact pads 128a (if fourth via 124a is included) or 128b and 128c or 128d, measuring a voltage across the semiconductor device component 110 caused by the second current, and calculating the second resistance based on the second current and the voltage measured, using Ohms law (e.g., R=V/I), for example. The second resistance is then compared to the initial first resistance to determine an amount of electromigration of the semiconductor device component 110 due to the first current applied (step 160).

If the second resistance is found to be substantially the same as the initial first resistance, then no substantial deleterious electromigration effects have been created on the semiconductor device component 110. However, if the second resistance is higher than the initial first resistance, then electromigration has affected the semiconductor device component 110, and the amount of electromigration damage can be determined by the magnitude of the resistance difference. If the second resistance is found to be infinite (e.g., there is no current flow when the second voltage is applied) or a resistance shift is found in a predetermined amount of value such as 5%, 10%, 20%, etc., then an open circuit or damage, respectively, in a portion of the semiconductor device component 110 has occurred and has been determined using the semiconductor device component, for example. Thus, electromigration characteristics can be detected and predicted for a semiconductor device 100 using the novel semiconductor device component 110 when used as an electromigration test structure.

The vias 124a, 124b, 124c, and 124d advantageously provide flexibility to the testing method. For example, the first current may be applied from the fourth via 124a to the third via 124d, from the fourth via 124a to the second via 124c, from the first via 124b to the third via 124d, and/or from the first via 124b to the second via 124c. In some embodiments, the first current and the second current may be applied in the same current path. For example, if the first current is applied from the fourth via 124a to the second via 124c, then the second current may also be applied from the fourth 124a to the second via 124c. Alternatively, the first current and the second current may be applied in different current paths.

A location of electromigration damage in the semiconductor device component 110 may be determined in some embodiments, based upon where the current is applied. The voltage measured may be different for different current paths. As one example, different voltage measurements may be obtained by applying a second current from the first via 124b to the third via 124d and from the fourth via 124a to the second via 124c.

For example, in some applications and some types of electromigration damage produced, it may be possible to determine whether the electromigration damage produced from the first current resides in the conductive segment 114, the first via 124b, the second via 124c, the third via 124d, and/or the fourth via 124a of the semiconductor device component 110. As one example, if a change in the resistance or an open circuit is produced somewhere in the semiconductor device component 110 by the application of the first current, then an increase in resistance between particular vias 124a or 124b and 124c or 124d may indicate the location of the increased resistance area or the open circuit. Because current is applied and the voltage is measured, a very large voltage measurement (e.g., proximate an upper measurement tool limitation) is indicative of an open circuit, for example. Thus, different stress current directions may be used to separate electromigration failure modes, and all possible damage paths in the semiconductor device components 110 during the testing process may be considered, due to the novel arrangement of the elements (e.g., the conductive segment 114 and the vias 124a, 124b, 124c, and 124d) of the semiconductor device component 110.

Because electromigration is current direction dependent, the failure location may generally occur only at one site (e.g., a cathode site vs. an anode site). Thus, in some embodiments, the fourth via 124a is not included, and only the first via 124b, the second via 124c, and the third via 124d are included in the novel semiconductor device component 110. In this embodiment, the first current and the second current are applied from the first via 124b to the third via 124d or from the first via 124b to the second via 124c, for example.

Figure 7A:
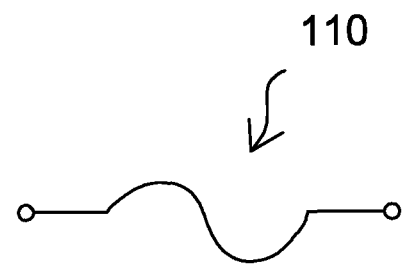
FIGS. 7A and 7B illustrate schematic representations of an eFuse of embodiments of the present disclosure before and after programming, respectively.
Figure 7B:
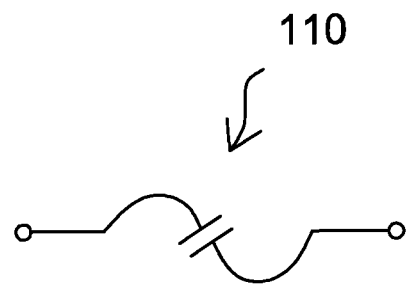

Embodiments of the present disclosure may also be implemented as eFuses. For example, the semiconductor device components 110 described herein may be implemented wherein the conductive segment 114 comprises a fuse link of a semiconductor device component 110 comprising an eFuse. FIGS. 7A and 7B illustrate schematic representations of an eFuse 110 of embodiments of the present disclosure before and after programming, respectively. To program or "blow" the eFuse 110, current is applied from the first via 124b to the second via 124c, or from the first via 124b to the third via 124d, advantageously providing two paths for current flow for programming the eFuse 110, in embodiments wherein the fourth via 124a is not included. In embodiments wherein the fourth via 134a is included, the eFuse 110 may advantageously be programmed using a choice of fourth current paths, which also include applying the current from the fourth via 124a to the second via 124c, or from the fourth via 124a to the third via 124d, allowing a large amount of programming flexibility for the eFuse 110. The novel eFuses 110 are formed in metallization layers M1, V1, M2, V2, and M3 of a semiconductor device 100 rather than in FEOL processes.

Advantages of embodiments of the present disclosure include providing novel semiconductor device components 110 and methods. The semiconductor device components 110 and methods comprising electromigration test structures simulate functional circuitry (e.g., metallization layers) on a semiconductor device 100 and are useful in detecting conductive line processing weaknesses, which is particularly useful in advanced metallization and interconnect systems. Different failure modes due to electromigration can be separated, including indicating if a via barrier layer 130 is too thin, as an example. More accurate electromigration lifetime predictions are achievable using the semiconductor device components 110 and methods. An entire test process damage path may be tested to identify locations of electromigration damage in the semiconductor device components 110. The semiconductor device component 110 may alternatively comprise eFuses that have a large amount of programming flexibility, in which a high current is intentionally applied to cause electromigration failures and program the eFuses. The eFuses may be programmed and used for circuit repair to replace failing or failed circuits with spare, redundant circuits (that are formed elsewhere over the workpiece 102, not shown in the drawings) or to increase the number of usable ICs over the workpiece 102, as examples. The novel semiconductor device components 110 and designs are easily implementable in manufacturing process flows for the semiconductor devices 100 they are formed on.

Embodiments of the present disclosure include the semiconductor device components 110 described herein, and semiconductor devices 100 that include the semiconductor device components 110. Embodiments of the present disclosure also include methods of testing semiconductor devices 100 for electromigration using the novel semiconductor device components 110 described herein that comprise electromigration test structures. Embodiments of the present disclosure also methods of manufacturing the semiconductor device components 110 and methods of programming fuse links of semiconductor device components 110 that comprise eFuses described herein.

In accordance with one embodiment of the present disclosure, a semiconductor device component includes a conductive segment having a first surface, a second surface opposite the first surface, a first end, and a second end opposite the first end. A first via is coupled to the second surface of the conductive segment at the first end. A second via is coupled to the first surface of the conductive segment at the second end, and a third via is coupled to the second surface of the conductive segment at the second end.

In accordance with another embodiment, a semiconductor device includes a workpiece and a plurality of metallization layers disposed over the workpiece. A semiconductor device component is disposed in the plurality of metallization layers, the semiconductor device component comprising a conductive segment having a first surface, a second surface, a first end, and a second end. The semiconductor device component also includes a first via coupled to the second surface of the conductive segment at the first end, a second via coupled to the first surface of the conductive segment at the second end, and a third via coupled to the second surface of the conductive segment at the second end.

In accordance with yet another embodiment, a method of testing a semiconductor device includes providing a workpiece having an electromigration test structure described herein formed thereon, and determining an initial first resistance of an EM test line of the electromigration test structure. A current is applied to the EM test line, and a second resistance of the EM test line is determined after applying the current to the EM test line. The second resistance is compared to the initial first resistance to determine an amount of electromigration of the EM test line.

In accordance with still another embodiment, provided is a device including a conductive line in a first metal layer, and a first via landing on a first surface of the conductive line adjacent the first end, and a second via landing on a second surface of the conductive line adjacent the first end, and a third via landing on the first surface of the conductive line adjacent the second end. The device further includes a second conductive line in a second metal layer, wherein either the first via or the third via lands on the second conductive line.

In accordance with yet another embodiment, provided is a device including a conductive line. The device further includes a first via coupled to a first surface of the conductive line at a first end, a second via coupled to a second surface of the conductive line at the first end, a third via coupled to the first surface of the conductive line at the second end, and a fourth via coupled to the second surface of the conductive line at the second end.

In still yet another embodiment, provided is a fuse. The fuse includes a fuse element in a first metal layer, the fuse element having a top surface and a bottom surface, and having a first length extending from a first end to a second end, and a first width extending orthogonal to the first length. The fuse also includes a first via contacting the top surface of the fuse element at the first end and extending from the first metal layer to an overlying metal layer, a second via contacting the bottom surface of the fuse element at the first end and extending from the first metal layer to an underlying metal layer, and a third via contacting the top surface of the fuse element at the second end and extending from the first metal layer to the overlying metal layer. The fuse further includes a first conductive element in the overlying metal layer electrically coupling the first end of the fuse to a first contact pad, a second conductive element in the underlying metal layer electrically coupling the second end of the fuse to a second contact pad, and a third conductive element in the overlying metal layer electrically coupling the second end of the fuse to a third contact pad. Each of the first conductive element, the second conductive element, and the third conductive element has a width that is greater than the first width.

Although embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods, and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device, comprising:
   a first conductive line in a first metal layer, the first conductive line having a first surface, a second surface opposite the first surface, a first end, and a second end opposite the first end;
   a first via landing on the first surface of the first conductive line adjacent the first end;
   a second via landing on the second surface of the first conductive line adjacent the first end;
   a third via landing on the first surface of the first conductive line adjacent the second end; and
   a second conductive line in a second metal layer, wherein one of the first via and the third via lands on the second conductive line, wherein the first conductive line, the second conductive line, the first via, the second via, and the third via are disposed on a scribe line of a semiconductor wafer.

2. The device of claim 1, further comprising:
   a fourth via landing on the second surface of the first conductive line adjacent the second end.

3. The device of claim 2, further comprising:
   a third conductive line in a third metal layer, wherein one of the second via and the fourth via lands on the third conductive line.

4. The device of claim 2, wherein the first via lands on the second conductive line, and further comprising:
   a third conductive line in a third metal layer, wherein the second via lands on the third conductive line;
   a fourth conductive line in the second metal layer, wherein the third via lands on the fourth conductive line; and
   a fifth conductive line in the third metal layer, wherein the fourth via lands on the fifth conductive line.

5. The device of claim 4, further comprising:
   a first contact pad, the second conductive line terminating on the first contact pad;
   a second contact pad, the third conductive line terminating on the second contact pad;
   a third contact pad, the fourth conductive line terminating on the third contact pad; and
   a fourth contact pad, the fifth conductive line terminating on the fourth contact pad.

6. The device of claim 1, wherein:
   the first conductive line has a first length extending in a first direction from the first end to the second end, and a first width extending in a second direction orthogonal to the first direction, wherein the first width is a minimum feature size of the device.

7. The device of claim 6, wherein the second conductive line has a second width, the second width being at least twice the first width.

8. The device of claim 6, wherein the first via has first diameter, the first diameter being substantially equal to the first width.

9. A device, comprising:
   a conductive line having a first surface, a second surface opposite the first surface, a first end, and a second end opposite the first end;
   a first via coupled to the first surface of the conductive line at the first end;
   a second via coupled to the second surface of the conductive line at the first end;
   a third via coupled to the first surface of the conductive line at the second end; and
   a fourth via coupled to the second surface of the conductive line at the second end, wherein the conductive line, the first via, the second via, the third via, and the fourth via are disposed on a scribe line of a semiconductor wafer, disposed on a dedicated test integrated circuit of a semiconductor wafer, or disposed on a functional integrated circuit.

10. The device according to claim 9, wherein the conductive line comprises a fuse.

11. The device according to claim 9, wherein the second via is coupled to the second surface of the conductive line proximate the first via, and wherein the fourth via is coupled to the second surface of the conductive line proximate the third via.

12. The device according to claim 9, wherein the first via is disposed directly over the second via above the conductive line, and wherein the third via is disposed directly over the fourth via above the conductive line.

13. The device according to claim 9, wherein the conductive line comprises a first width, and wherein the first via, the second via, the third via, and the fourth via comprise substantially the first width on at least a portion thereof.

14. A fuse comprising:
   a fuse element in a first metal layer, the fuse element having a top surface and a bottom surface, and having a first length extending from a first end to a second end, and a first width extending orthogonal to the first length;
   a first via contacting the top surface of the fuse element at the first end and extending from the first metal layer to an overlying metal layer;
   a second via contacting the bottom surface of the fuse element at the first end and extending from the first metal layer to an underlying metal layer, wherein a first width of the second via decreases as the second via extends from the first metal layer to an underlying metal layer;
   a third via contacting the top surface of the fuse element at the second end and extending from the first metal layer to the overlying metal layer, wherein a second width of at least one of the first via and the third via increases as the first via and the third via extend from the first metal layer to the overlying metal layer;
   a first conductive element in the overlying metal layer electrically coupling the first end of the fuse to a first contact pad;
   a second conductive element in the underlying metal layer electrically coupling the second end of the fuse to a second contact pad; and
   a third conductive element in the overlying metal layer electrically coupling the second end of the fuse to a third contact pad,
   wherein each of the first conductive element, the second conductive element, and the third conductive element has a width that is greater than the first width,
   wherein the first contact pad, the second contact pad, and the third contact pad are different contact pads; and
   wherein the first contact pad, the second contact pad and the third contact pad are in a same metal layer.

15. The fuse of claim 14, further comprising:
   a fourth via contacting the bottom surface of the fuse element at the second end and extending from the first metal layer to the underlying metal layer; and
   a fourth conductive element in the underlying metal layer electrically coupling the first end of the fuse to a first contact pad.

16. The fuse of claim 15, wherein the fuse can be programmed from a conductive state to a non-conductive state by supplying programming current through a path selected from the group consisting of the first via to the third via, the first via to the fourth via, the second via to the third via, the second via to the fourth via, and combinations thereof.

17. The device of claim 1, wherein the first conductive line is a fuse link of an electrically programmed fuse (eFuse).

18. The fuse of claim 14, wherein the first width is between about 0.01 μm and about 0.1 μm.

19. The fuse of claim 15, wherein a third width of the fourth via decreases as the fourth via extends from the first metal layer to an underlying metal layer.

20. The device of claim 1, wherein at least one of the first via, the second via, and the third via comprises a substantially annular barrier layer surrounding a substantially circular shaped copper conductor.

21. The device of claim 20, wherein:
   at least one of the first via and the third via has a first diameter at a first end proximate the first conductive line and a second diameter at a second end proximate the second metal layer, wherein the second diameter is greater than the first diameter; and
   the second via has a first diameter at a first end proximate the first conductive line and a second diameter at a second end proximate the a metal layer, wherein the second diameter is less than the first diameter.

* * * * *